(12) United States Patent
Middlebrooks

(10) Patent No.: US 7,089,164 B2
(45) Date of Patent: Aug. 8, 2006

(54) CONTROL OF OVERLAY REGISTRATION

(75) Inventor: Scott A. Middlebrooks, Sandy, OR (US)

(73) Assignee: Model Predictive Systems, Inc., Portland, OR (US)

( * ) Notice: Subject to any disclaimer, the term of this patent is extended or adjusted under 35 U.S.C. 154(b) by 226 days.

(21) Appl. No.: 10/665,980

(22) Filed: Sep. 19, 2003

(65) Prior Publication Data

US 2005/0083243 A1    Apr. 21, 2005

(51) Int. Cl.
*G06F 17/10* (2006.01)
*H01L 21/00* (2006.01)

(52) U.S. Cl. .............................. 703/2; 716/19; 716/20; 700/121

(58) Field of Classification Search .................... 703/2; 716/19, 20, 21; 700/121
See application file for complete search history.

(56) References Cited

U.S. PATENT DOCUMENTS 4,551,015 A * 11/1985 Goemans ...................... 355/75

5,968,607 A * 10/1999 Lovison ...................... 427/511

OTHER PUBLICATIONS

Abughazaleh et al., S.A. Null holographic test structures for the measurement of overlay and its statistical vrariation, IEEE Transactions on Semiconductor Manufacturing, vol. 13, No. 2, May 2000, pp. 173-180.*
Middlebrooks, Scott A., "Optimal Model-Predictive Control of Overlay Lithography Implemented in an ASIC Fab" Proceedings of SPIE, Microlithography 2003, 5044-2.
Muske, Kenneth Robert, "Linear Model Predictive Control of Chemical Processes" University of Texas at Austin, May 1995.

* cited by examiner

*Primary Examiner*—Russell Frejd
(74) *Attorney, Agent, or Firm*—Van Pelt, Yi & James LLP

(57) ABSTRACT

A system and method are disclosed for controlling a registration overlay. The method comprises estimating a state using moving horizon estimation and determining an input of the registration overlay using the state. The system comprises an estimator configured to determine a state using moving horizon estimation; and a regulator configured to determine an input of the registration overlay using the state.

29 Claims, 5 Drawing Sheets

CONTROL OF OVERLAY REGISTRATION

FIELD OF THE INVENTION

The present invention relates generally to semiconductor processing. More specifically, an overlay registration control technique is disclosed.

BACKGROUND OF THE INVENTION

Semiconductor devices are commonly fabricated using lithography techniques, where layers of material are deposited onto or etched away from a wafer to form devices and circuits. Typically, after a layer of material is deposited or etched and before the wafer is further processed, the wafer is measured and realigned with an alignment tool to reduce any errors resulting from misalignment. As semiconductor devices shrink in size, the requirements for controlling the misalignment errors have become more stringent. Many systems in existence today employ an overlay registration technique to reduce overlay misalignment errors.

FIG. 1 is a diagram illustrating a wafer used in an overlay registration process. FIG. 100 includes a number of dies 102. On each die, there are a number of test patterns 106. On each die there are four test patterns that are measured by the alignment tool, resulting in four overlay misalignment vectors 104. The misalignment vectors are typically calculated as the summations of the interfield errors (also referred to as grid errors) and intrafield errors (also referred to as reticle errors).

In Proceedings of SPIE, Microlithography 2003, 5044-2 entitled "OPTIMAL MODEL-PREDICTIVE CONTROL OF OVERLAY LITHOGRAPHY IMPLEMENTED IN AN ASIC FAB" by Scott Middlebrooks, which is incorporated herein by reference for all purposes, Middlebrooks describes a model predictive controller that estimates system states and regulates the states to desired targets. The controller employs a Kalman filter to estimate the current values of the system states given measured outputs. Given an optimal estimate, a regulator is used to drive the estimated system states to desired targets. The controller attempts to reject the process disturbances in one input move, and is known as a "deadbeat" controller.

Although this deadbeat controller, which includes using a Kalman filter for estimating the states, is useful in misalignment correction, several issues remain. It would be useful to take into account the constraints of the system, such as the range of valid inputs, and states. A common approach to handling values that are out of bound is to clip these values; however, clipping often results in sub-optimal selection of values. Although estimating states using a Kalman filter works well for linear systems, it may introduce errors and provide sub-optimal and unstable state estimates for non-linear systems. It would be useful to have a controller that can handle both input and state constraints as well as being able to handle both linear and non-linear systems.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, are referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and invention may be practiced according to the claims without some or all of these specific details. For the purpose of clarity, technical material that is known in the technical fields related to the invention has not been described in detail so that the invention is not unnecessarily obscured.

An improved technique for controlling registration overlay is disclosed. In some embodiments, the system performs a moving horizon estimation to estimate state, and determines an input of the registration overlay using an objective function subject to constraints. In some embodiments, the estimated states are subject to state constraints. In some embodiments, the regulator objective function is minimized subject to input constraints. In some embodiments, the system employs an estimator objective function used to derive the optimal estimated states and a regulator objective function used to derive the optimal inputs based on the estimated states. The optimization problems may be solved using techniques including quadratic programming, nonlinear programming, or any other appropriate techniques. In some embodiments, a state disturbance model is used to remove the steady-state offsets that are due to mismatch between predictions and actual measurements.

Figure 2:
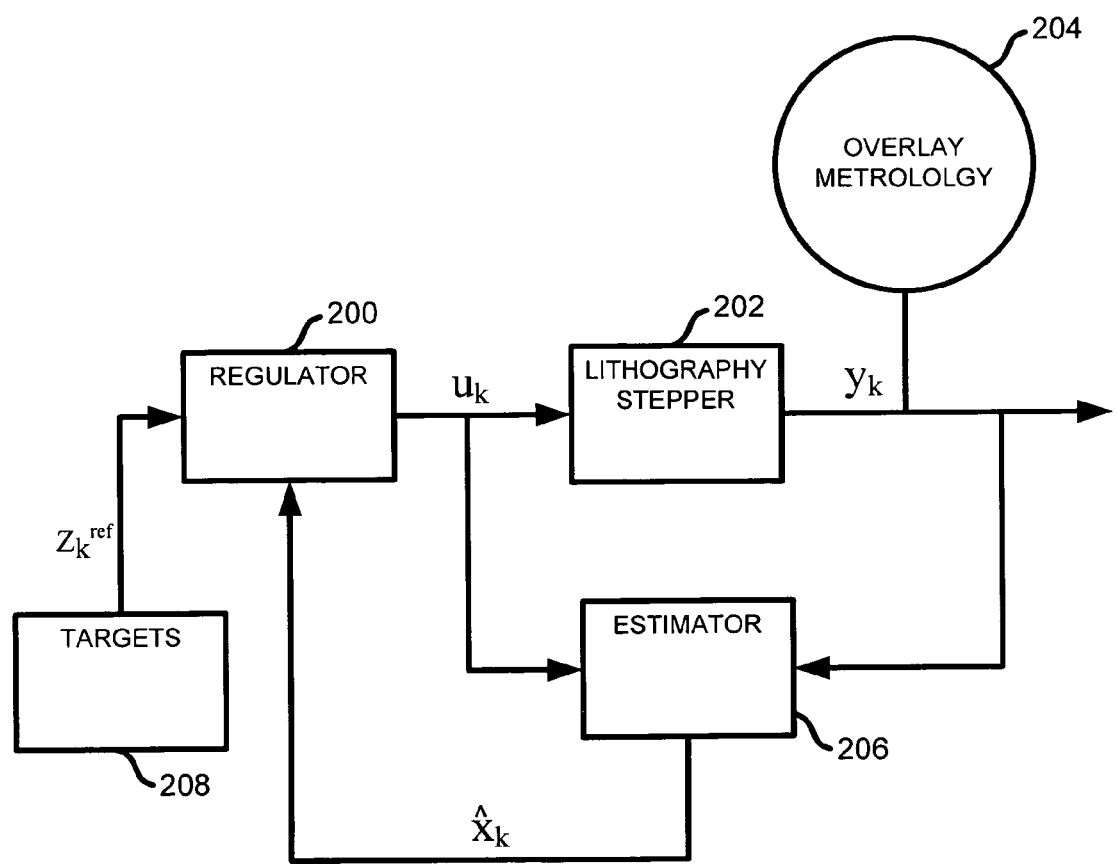
FIG. 2 is a system diagram illustrating a controller embodiment.

FIG. 2 is a system diagram illustrating a controller embodiment. The system has an overlay model used to describe the relationship between lithography stepper 202 and overlay metrology tool 204. In this embodiment, the model is expressed as:

$$\frac{dx}{dt} = Ax + Bu + \omega \qquad (1)$$

$$y = Cx$$

where A and B and C are model coefficients, x represents the state of the system, u represents the inputs of the system, y represents the outputs of the system, and ω represents noise that is present in the system. The inputs typically refer to system parameters that are manipulated by a user of the system. The states refer to information that characterizes the system; they typically have some correspondence with the inputs. The outputs typically refer to measurements taken on the system. The model of the system may vary for different embodiments. For example, it may be a linear function or a nonlinear function. Since the model function and its coefficients typically are not perfect representations of the system being controlled, in order to properly adjust the system to achieve desired outputs, measurements are taken during an estimation process to derive the coefficients and sometimes the model function itself. More details of the estimation process will be discussed below.

A regulator 200 is used to provide system inputs to drive the system states to desired targets. The regulator is given a target vector $Z_k^{ref}$, which specifies the goal of the system. In this embodiment, the goal of the controller is to regulate the overall process to minimize alignment errors, thus the target vector $Z_k^{ref}$ is a vector of 0. Different target vectors may be used in other embodiments. In this embodiment, the input, represented as a vector $u_k$, includes settings of a lithography stepper 202 such as translational movement of the wafer in x and y directions, wafer rotation, reticle magnification, asymmetric magnification, reticle rotation, asymmetric reticle rotation, as well as any other appropriate configuration parameters. The lithography stepper changes the relative positioning of the wafer by adjusting the wafer, the mask or any other appropriate devices according to its input.

Figure 1:
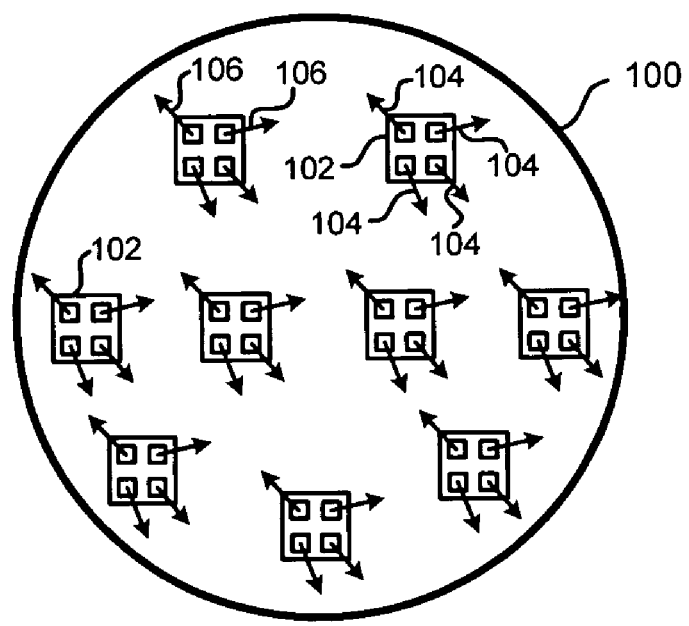
FIG. 1 is a diagram illustrating a wafer used in an overlay registration process.

An overlay metrology tool 204 measures the position of the wafer and provides an output $y_k$. In some embodiments, $y_k$ is represented using misalignment vectors similar to the ones shown in FIG. 1. An estimator 206 reconstructs the system states and provides an estimated state vector $\hat{x}_K$ based on the input of the lithography stepper $u_k$, the system model and the output $y_k$. The states characterize the system, and may include parameters such as wafer translation in x and y directions, wafer scale in x and y directions, wafer rotation, wafer nonorthogonality, reticle magnification, asymmetric magnification, reticle rotation, and asymmetric reticle rotation, as well as process disturbances in the previously mentioned states. Although the states have certain correspondence to the inputs, and in some embodiments the states and the inputs may share certain variables, they are not necessarily equivalent. For example, the state may indicate degrees of rotation of the wafer while the input may indicate the number of rotations of a knob that results in such a rotation.

The estimator is designed to find the most likely states given the model, the inputs and the measured outputs. Typically, this is achieved by adjusting the model to fit measurement data the best it can. An estimator objective function is typically formulated to minimize the difference between the measurements and the predictions subject to the constraints on the estimated states. The estimated states are sent back to regulator 200, which has a regulator objective function formulated to express the performance objective of the controller. The regulator objective function is typically defined by the user. According to the regulator objective function, the regulator drives the system states to desired targets $z_k^{ref}$ based on the estimated state and computes a new set of inputs for tracking $z_k^{ref}$ closely, using the estimated state as the initial starting point for the optimization.

Ideally, the estimator would provide the optimal estimated states to the regulator, and the regulator would then provide an input to minimize the misalignment errors and meet the desired target. In real systems, however, the regulator objective function is frequently subject to various constraints that preclude such an optimal input from being usable. For example, an input constraint may be that the magnification is between 0 and 1.0; therefore an optimal input with a magnification of 5.0 is not reasonable. The regulator's objective function explicitly takes into account each input constraint and provides the best practical input.

Figure 3:
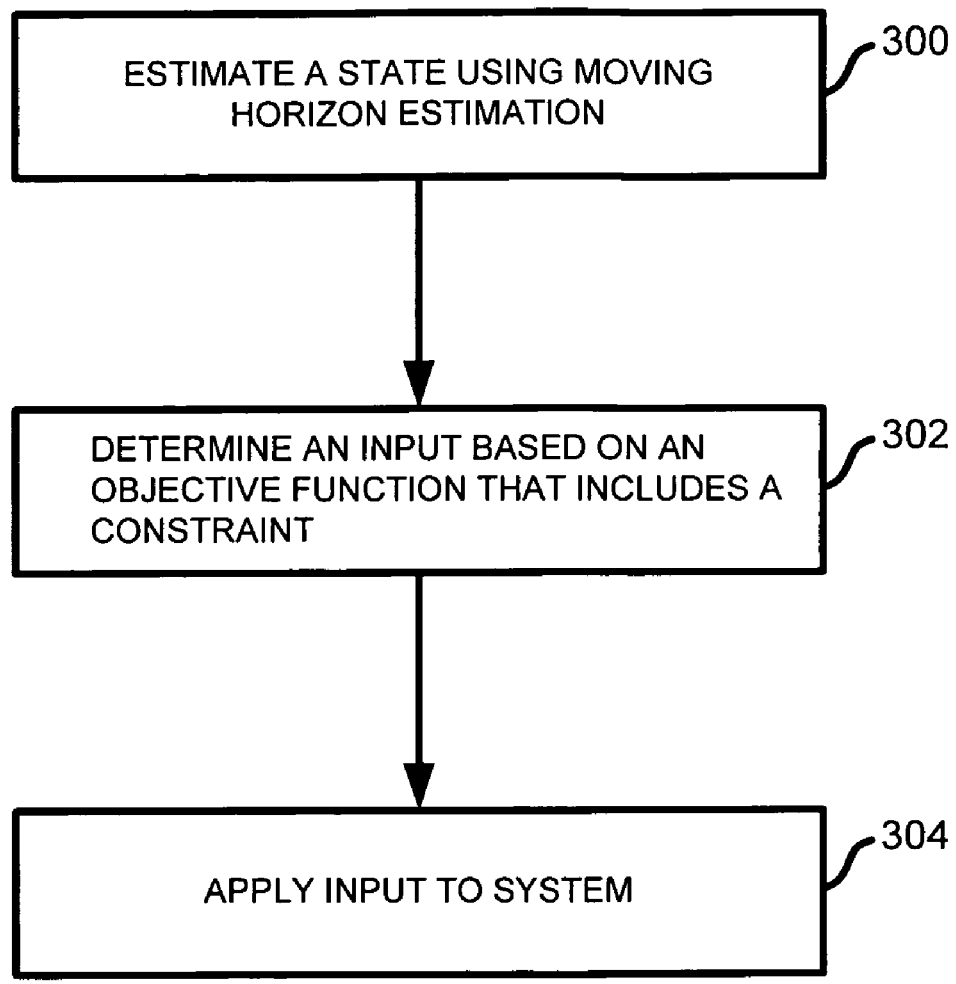
FIG. 3 is a flowchart illustrating the control process of an overlay registration control embodiment.

FIG. 3 is a flowchart illustrating the control process of an overlay registration control embodiment. The estimator estimates a state using a moving horizon estimation (MHE) technique (300), which is described in more detail below. An input based on the estimated state is then determined by the regulator (302). The input is then applied to the system to meet the target (304).

Figure 4:
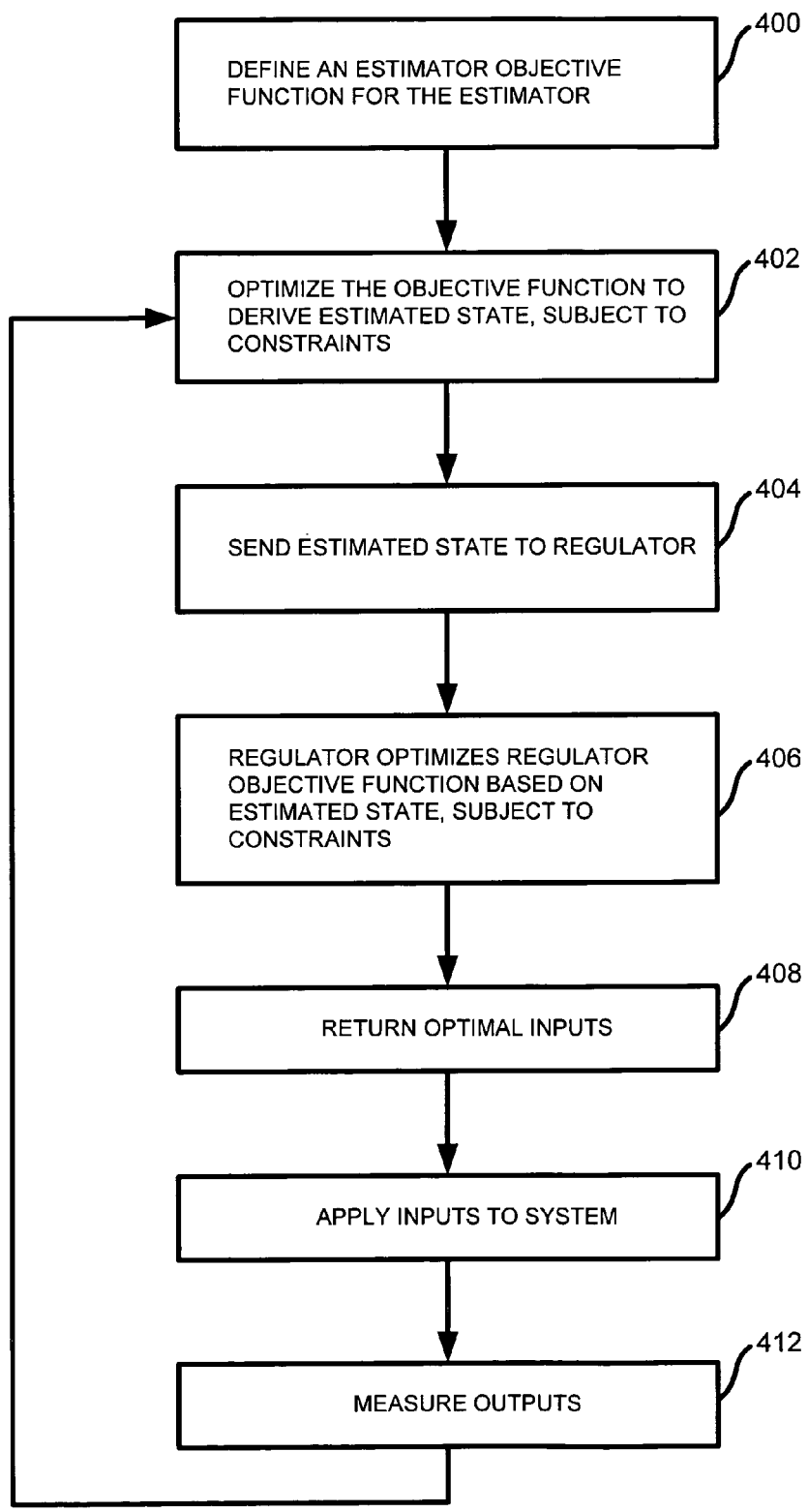
FIG. 4 is a flowchart of a controller process according to another overlay registration embodiment.

FIG. 4 is a flowchart of a controller process according to another overlay registration embodiment. An estimator objective function is defined (400). The estimator objective function is optimized in order to derive an estimated state subject to state constraints (402). Various optimization techniques may be employed, including nonlinear programming (NLP), quadratic programming (QP) as well as any other appropriate techniques. The estimated state is sent to the regulator (404), which has a user defined regulator objective function. The regulator optimizes on the regulator objective function based on the estimated states and subject to the input constraints (406). The optimal inputs are returned by the regulator (408), and then applied to the system (410). The outputs are then measured (412), and the state estimator updates the system state again and the process is repeated.

In one embodiment, the estimator objective function is defined based on the difference between the measured outputs and the predicted outputs, expressed as:

$$\min_{x^N} \Phi_k = \sum_{j=0}^{N} \left\| y_{k+j}^{meas} - y_{k+j}^{pred} \right\|^2 R. \quad (2)$$

The most likely estimated states in this case include values that minimize the result of the estimator objective function, subject to the system model and the state constraints. R is a weighting matrix.

Figure 5:
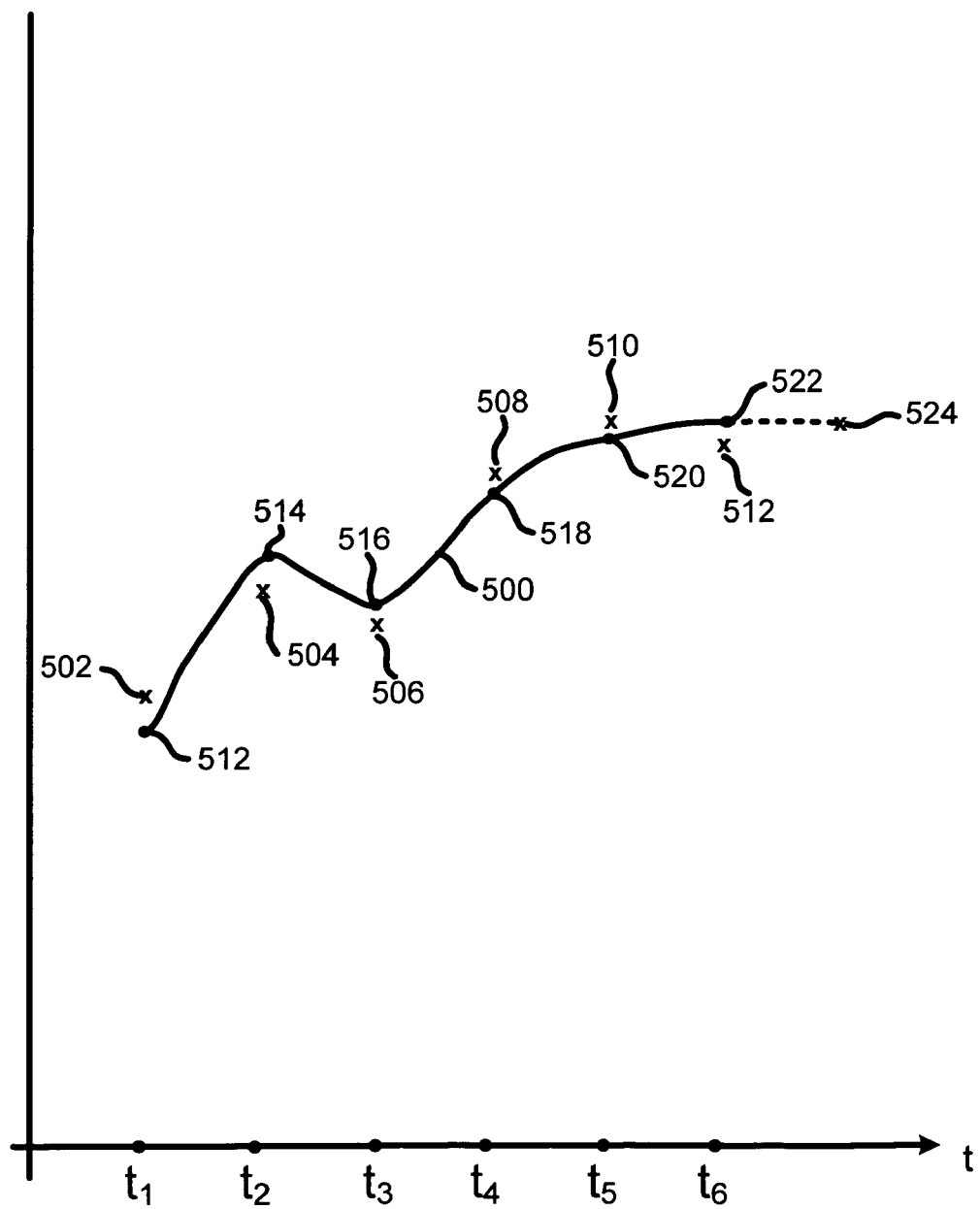
FIG. 5 is a diagram illustrating the operations of moving horizon estimation in one dimension.

Also in this embodiment, the regulator objective function is a scalar objective function defined as the following open loop quadratic equation:

$$\min_{u^N} \Phi_k = \sum_{j=0}^{N} \left\| z_{k+j}^{ref} - z_{k+j} \right\|^2 Q + \left\| \Delta U_{k+j} \right\|^2 S,$$

where Q and S are the weighing matrices that penalize the deviation from target and the rate of change of the inputs, respectively, and N is the prediction horizon. The function includes various system constraints such as the range of values for the inputs, u. Due to the constraints, the equation cannot be solved by doing a simple model inversion. Instead, techniques such as quadratic programming (QP) are used to solve this objective function. FIG. 5 is a diagram illustrating the operations of moving horizon estimation in one dimension. Although other dimensions are not shown, their constraints are also taken into consideration during the estimation process. MHE has an estimation horizon, N, defined as the number of previous measurements that are used for making the current estimation. This value is implementation dependent. In the embodiment shown, six measurements 502–512 taken at times t1–t6 are compared with their corresponding predictions 512–522 according to model function 500, giving an estimation horizon of 6. The differences are used to solve an estimation objective function that gives the least amount of total error between the measurements and the predictions. Techniques including NLP, QP and least-mean square fit (LMS) are applicable for solving the minimization problem. Based on the model function, an estimated state 524 is made.

In some embodiments, the system is operating in steady-state and does not have time dynamics. A prediction horizon of 1 is sometimes sufficient for solving the objective function. An objective function is posed, and it is minimized subject to the state constraints. In some embodiments, the objective function may not be solvable because there are more states than available measurements. Under such circumstances, observability techniques may be applied to determine whether additional measurements should be performed.

In some embodiments, disturbances in the inputs, states and/or outputs may cause a mismatch or bias between the predictions and the actual measurements. A disturbance model is sometimes used to remove the steady-state offsets due to the mismatch. According to the disturbance model, the error between the output measurements and the predicted outputs are due to integrated disturbances in one or more states, inputs or outputs. Thus, to remove the effects of the offsets, these integrating disturbances are integrated into the system model. More details of disturbance removal may be found in Middlebrooks and "Linear Model Predictive Control of Chemical Processes" by Kenneth Robert Muske (Ph.D. Dissertation, The University of Texas at Austin, May 1995), which is herein incorporated by reference for all purposes.

An improved technique for controlling registration overlay has been disclosed. In some embodiments, a state estimator and regulator are used to handle constraints, including state constraints and input constraints. The techniques can also effectively handles nonlinear systems.

Although the foregoing invention has been described in some detail for purposes of clarity of understanding, it will be apparent that certain changes and modifications may be practiced within the scope of the appended claims. There are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method for controlling a registration overlay in semiconductor processing, comprising:
    a) estimating a state using moving horizon estimation; and
    b) determining an input of the registration overlay using the state; and
    c) applying the input.

2. A method for controlling a registration overlay as recited in claim 1, wherein estimating the state is subject to a state constraint.

3. A method for controlling a registration overlay as recited in claim 1, wherein the input determined is an optimal input.

4. A method for controlling a registration overlay as recited in claim 1, wherein determining the input is subject to an input constraint.

5. A method for controlling a registration overlay as recited in claim 1, wherein estimating the state is subject to a multi-dimensional constraint.

6. A method for controlling a registration overlay as recited in claim 1, wherein determining the input of the registration overlay using the state comprises evaluating an objective function.

7. A method for controlling a registration overlay as recited in claim 6, wherein the objective function is defined by a user.

8. A method for controlling a registration overlay as recited in claim 6, wherein the objective function includes a deviation from a target.

9. A method for controlling a registration overlay as recited in claim 6, wherein the objective function includes a rate of change of inputs.

10. A method for controlling a registration overlay as recited in claim 1, wherein determining the input of the registration overlay using the state comprises evaluating an objective function and determining an optimal solution of the objective function subject to an input constraint.

11. A method for controlling a registration overlay as recited in claim 1, wherein estimating the state using a moving horizon estimation comprises evaluating an estimator objective function, subject to a state constraint.

12. A method for controlling a registration overlay as recited in claim 1, wherein estimating the state using a moving horizon estimation comprises taking an output measurement and evaluating an estimator objective function based on the output measurement.

13. A method for controlling a registration overlay as recited in claim 1, wherein estimating the state using a moving horizon estimation comprises optimizing an estimator objective function.

14. A method for controlling a registration overlay as recited in claim 1, wherein estimating the state using a moving horizon estimation comprises optimizing an estimator objective function using a quadratic programming technique.

15. A method for controlling a registration overlay as recited in claim 1, wherein estimating the state using a moving horizon estimation comprises optimizing an estimator objective function using a nonlinear programming technique.

16. A method for controlling a registration overlay as recited in claim 1, wherein determining the input of the registration overlay using the state comprises evaluating a regulator objective function.

17. A method for controlling a registration overlay as recited in claim 1, wherein determining the input of the registration overlay using the state comprises optimizing a regulator objective function.

18. A method for controlling a registration overlay as recited in claim 1, wherein determining the input of the registration overlay using the state comprises optimizing a regulator objective function using a quadratic programming technique.

19. A method for controlling a registration overlay as recited in claim 1, wherein determining the input of the registration overlay using the state comprises optimizing a regulator objective function using a least-mean squared fit technique.

20. A method for controlling a registration overlay as recited in claim 1, wherein determining the input of the registration overlay using the state comprises optimizing a regulator objective function using a nonlinear programming technique.

21. A method for controlling a registration overlay as recited in claim 1, wherein determining the input of the registration overlay using the state comprises optimizing a regulator objective function using a least-mean squared fit technique.

22. A method for controlling a registration overlay as recited in claim 1, further comprising repeating a)–b) until a desired input is obtained.

23. A method for controlling a registration overlay as recited in claim 1, further comprising removing a steady-state offset by using a state disturbance model.

24. A method for controlling a registration overlay as recited in claim 1, further comprising removing a steady-state offset by using a disturbance model that integrates a disturbance.

25. A method for controlling a registration overlay as recited in claim 24, wherein the disturbance comprises an input disturbance.

26. A method for controlling a registration overlay as recited in claim 24, wherein the disturbance comprises a state disturbance.

27. A method for controlling a registration overlay as recited in claim 24, wherein the disturbance comprises an output disturbance.

28. A computer program product for controlling a registration overlay in semiconductor processing, the computer program product being embodied in a computer readable medium and comprising computer instructions for:

a) estimating a state using moving horizon estimation; and b) determining an input of the registration overlay using the state; and c) applying the input.

29. A system for controlling a registration overlay, comprising:

an estimator configured to determine a state using moving horizon estimation; and a regulator configured to determine an input of the registration overlay using the state and to apply the input.

* * * * *